(12) United States Patent
Kato et al.

(10) Patent No.: US 7,626,338 B2
(45) Date of Patent: Dec. 1, 2009

(54) DISCHARGE LAMP LIGHTING APPARATUS

(75) Inventors: Koichi Kato, Toyoake (JP); Yoshitaka Sato, Toyahashi (JP)

(73) Assignee: Denso Corporation, Kariya (JP)

( * ) Notice: Subject to any disclaimer, the term of this patent is extended or adjusted under 35 U.S.C. 154(b) by 812 days.

(21) Appl. No.: 11/401,294

(22) Filed: Apr. 11, 2006

(65) Prior Publication Data
US 2006/0227254 A1    Oct. 12, 2006

(30) Foreign Application Priority Data

Apr. 11, 2005   (JP)  ............................... 2005-113392
Jan. 30, 2006   (JP)  ............................... 2006-020320

(51) Int. Cl.
*H01J 7/44*     (2006.01)
(52) U.S. Cl. .............................. 315/56; 315/57; 315/70; 315/118; 315/276; 362/310; 362/265; 336/96
(58) Field of Classification Search ................... 315/56, 315/57, 70, 71, 77, 82, 112, 118, 224, 276, 315/291, 289, 307, DIG. 5; 362/265, 310, 362/507; 336/90, 96
See application file for complete search history.

(56) References Cited

U.S. PATENT DOCUMENTS 5,142,203 A *   8/1992   Oda et al. .................... 315/308
5,755,505 A *   5/1998   Hiramatsu ................... 362/581
6,040,659 A *   3/2000   Masuda et al. ................ 315/56
6,066,921 A *   5/2000   Nakamura et al. ............ 315/71
7,218,055 B2 *   5/2007   Kato ............................ 315/57
7,514,881 B2 *   4/2009   Kato ........................... 315/291

FOREIGN PATENT DOCUMENTS

| JP | 6-5424 | 1/1994 |
| JP | 9-246619 | 9/1997 |
| JP | 2003-318042 | 11/2003 |

* cited by examiner

*Primary Examiner*—Haissa Philogene
(74) *Attorney, Agent, or Firm*—Nixon & Vanderhye, PC (57) ABSTRACT

A discharge lamp lighting apparatus includes a transformer unit, a casing for housing the transformer unit, and a circuit board including circuit components. In the casing, the circuit board is joined to the casing and the transformer unit is fixed to the circuit board through a heat conductive member having thermal conductivity of more than 0.1 W/(m·k). Heat produced by the transformer unit is transferred to the casing through the heat conductive member and released through the casing effectively. In the lighting apparatus, therefore, while the transformer unit is arranged relatively close to the circuit components, the heat can be prevented from affecting the circuit components.

22 Claims, 10 Drawing Sheets

DISCHARGE LAMP LIGHTING APPARATUS

CROSS REFERENCE TO RELATED APPLICATION

This application is based on and incorporates herein by reference Japanese Patent Applications No. 2005-113392 filed on Apr. 11, 2005, and No. 2006-20320 filed on Jan. 30, 2006.

FIELD OF THE INVENTION

The present invention relates to a discharge lamp lighting apparatus for lighting a high-intensity discharge lamp.

BACKGROUND OF THE INVENTION

A lighting apparatus for lighting a high-intensity discharge lamp used as a headlight of a vehicle has been proposed, for example, in JP-A-2003-318042. In this type of lighting apparatus, a battery voltage is stepped up by a transformer, for example, a direct-current to direct-current (DC-DC) converter. A direct-current to alternating-current (DC-AC) inverter configured as a H-bridge (i.e., full bridge) circuit changes the stepped-up voltage, which is a direct voltage, to an alternating voltage. Thus, the discharge lamp is lit by the alternating voltage.

The lighting apparatus includes a metal casing and a busbar casing having a busbar and a terminal. A printed circuit board having a pad is housed in the metal casing. Circuit components including the DC-DC converter are housed in the busbar casing. The busbar casing is mounted on the metal casing and the terminal of the busbar casing is connected to the pad of the printed circuit board housed in the metal casing. Thus, the circuit components housed in the busbar casing are electrically connected to printed wiring provided on the printed circuit board.

The temperature of the DC-DC converter increases when the DC-DC converter steps up the battery voltage. The DC-DC converter is arranged away from circuit components having a low heat resistance so that heat produced by the DC-DC converter can be prevented from being transferred to the circuit components.

Recently, there has been an attempt to reduce the size of the lighting apparatus for the discharge lamp. However it is difficult to reduce the size of the busbar casing due to such a layout that the DC-DC converter is arranged away from the circuit components. Accordingly, it is difficult to reduce the size of the lighting apparatus.

SUMMARY OF THE INVENTION

In view of the above-described problem, it is an object of the present invention to provide a discharge lamp lighting apparatus in which while a transformer is arranged close to other circuit components, heat produced by the transformer is prevented from affecting the other circuit components.

A discharge lamp lighting apparatus includes a transformer unit having a transformer for generating a high voltage based on an electric power supplied from a power source, a casing for housing the transformer unit, a circuit board joined to the casing in the casing and including a component for driving the discharge lamp based on the high voltage generated by the transformer. The transformer unit is fixed to the circuit board through a heat conductive member having thermal conductivity much higher than that of air.

When the transformer generates the high voltage, the transformer unit produces heat and the temperature of the transformer unit increases. The heat is transferred to the casing through the heat conductive member and the circuit board. Thus, the heat is released through the casing widely so that peak temperature of the transformer unit can be reduced.

In the lighting apparatus, while the transformer unit is arranged relatively close to other circuit components, the heat produced by the transformer unit can be prevented from affecting the other circuit components. Therefore, the size of the lighting apparatus can be reduced.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

The present inventors have developed a prototype of a lighting apparatus, the size of which can be reduced. In the prototype, a protection film made of resin is disposed on a printed circuit board and a transformer unit is mounted on the printed circuit board through the protection film. In such an approach, the printed circuit board and the transformer unit overlaps so that the size of the lighting apparatus can be reduced.

In the prototype, the transformer unit is separated from the circuit board by the protection film. However, when the transformer unit produces heat and the temperature of the transformer unit increases, the heat may be transferred to other circuit components through the air. As a result, the transferred heat may damage the other circuit components First Embodiment As the first embodiment according to the present invention, a discharge lamp lighting apparatus for lighting a discharge lamp will now be described with reference to FIGS. 1-7.

Figure 1:
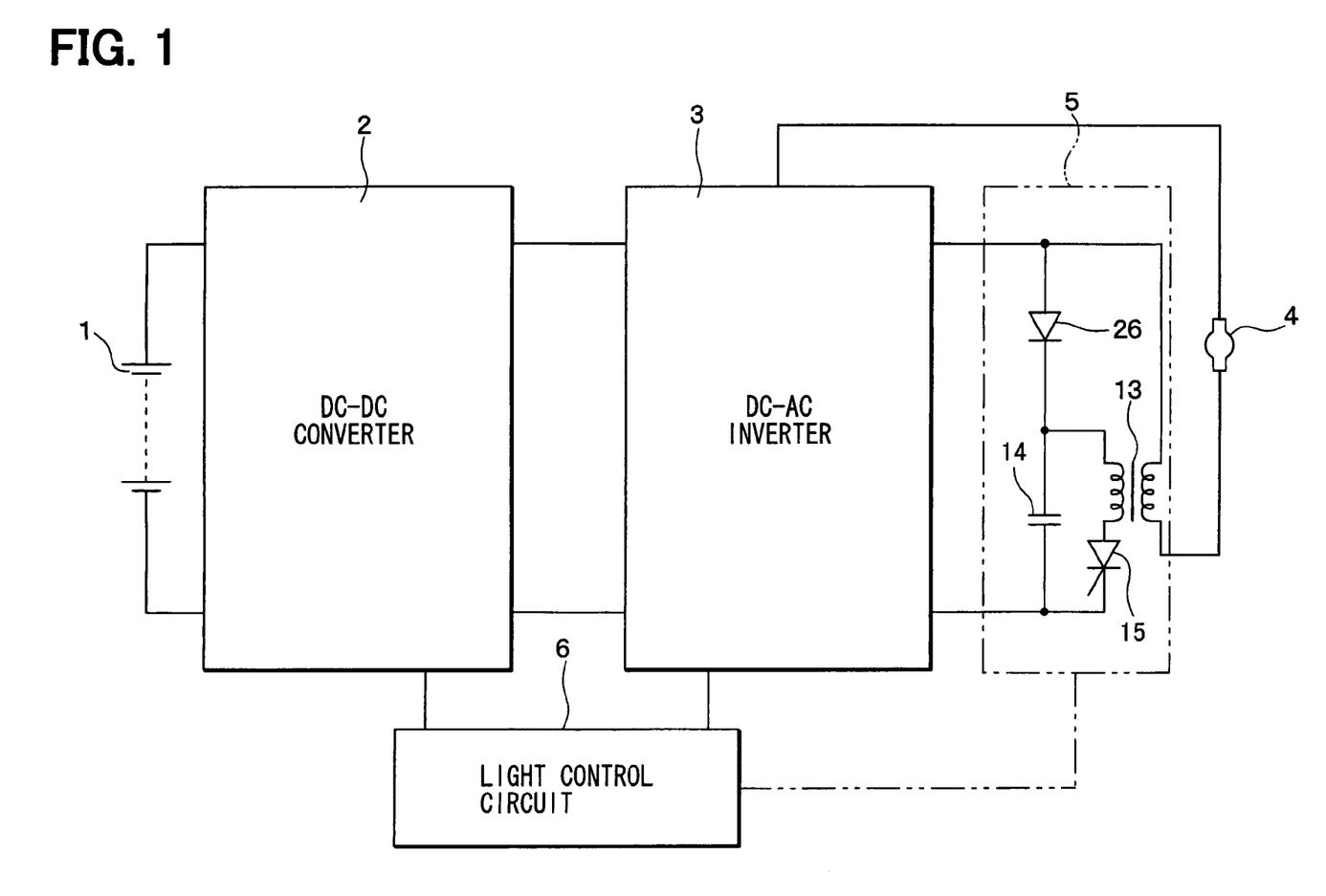
FIG. 1 is a block diagram of a discharge lamp lighting apparatus according to a first embodiment of the present invention.

FIG. 1 is a simplified block diagram of the lighting apparatus. In the lighting apparatus, a DC-DC converter 2 serving as a transformer steps up a voltage supplied from a battery 1, and an inverter circuit 3 configured as a H-bridge circuit changes the stepped-up voltage, which is a direct voltage, to an alternating voltage. The alternating voltage is applied to a discharge lamp 4, and thus the discharge lamp 4 is lit. Because the discharge lamp 4 needs a higher voltage at the time of start-up, the lighting apparatus includes a start-up circuit 5 for boosting the alternating voltage applied to the discharge lamp 4.

The start-up circuit 5 includes a starter transformer 13, a capacitor 14, and a thyristor 15. In the start-up circuit 5, the capacitor 14 starts charging up at the time of start-up of the discharge lamp 4. Then, when the thyristor 15 is turned on, the capacitor 14 starts discharging. Thus, the higher voltage is applied to the discharge lamp 4 through the starter transformer 13 and an electrical breakdown occurs between electrodes of the discharge lamp 4. As a result of the breakdown, the discharge lamp 4 is lit.

After the start-up of the discharge lamp 4, a light control circuit 6 performs feedback control of the voltage applied to the discharge lamp 4 and current flowing through the discharge lamp 4 so that the discharge lamp 4 can remain lit stably.

As shown in FIGS. 2-6, the lighting apparatus is housed in a body constructed with a casing 10, a busbar casing 11, and a case cover (not shown). The body allows the lighting apparatus to be mounted to, for example, a vehicle so that the lighting apparatus can be used for a headlight of the vehicle.

The casing 10 may be, for example, a metal case having a bottom wall and low sidewalls. A control circuit board 16 and a power circuit board 17 are arranged in the casing 10 such that the control circuit board 16 and the power circuit board 17 are physically separated from each other and electrically connected to each other through a bonding wire 21. The control circuit board 16 and the power circuit board 17 are attached to the bottom wall of the casing 10 through an adhesive member 40 shown in FIG. 7. The casing 10 has a mounting hole 12 on a corner portion. The mounting hole 12 allows the lighting apparatus to be fixed to an object.

The control circuit board 16 is a multilayer printed circuit board having a ceramic substrate as a base substrate. A first and a second conductive pattern are provided on a front and a back surface of the control circuit board 16, respectively. The first and the second conductive pattern are connected to each other through a through-hole provided in the ceramic substrate. Circuit components such as monolithic integrated circuits (MIC) 18, 20, a resistor 19a, a capacitor 19b, a transistor 19c, and a diode 19d are mounted to the control circuit board 16 by high density mounting technique. Thus, the control circuit board 16 has a very small size. These components mounted to the control circuit board 16 are used for a control circuit section such as the light control circuit 6 shown in FIG. 1, which operates at low voltage and produces little heat.

The power circuit board 17 is a single-layer printed circuit board having a ceramic substrate as a base substrate. A conductive pattern 17a is provided on a surface of the power circuit board 17. Circuit components such as an insulated-gate bipolar transistor (IGBT), a metal oxide semiconductor (MOS) transistor, a diode 26, and a transformer unit 25 having the DC-DC converter 2 are mounted to the power circuit board 17. These components mounted to the power circuit board 17 are relatively large in size and produce heat.

Figure 7:
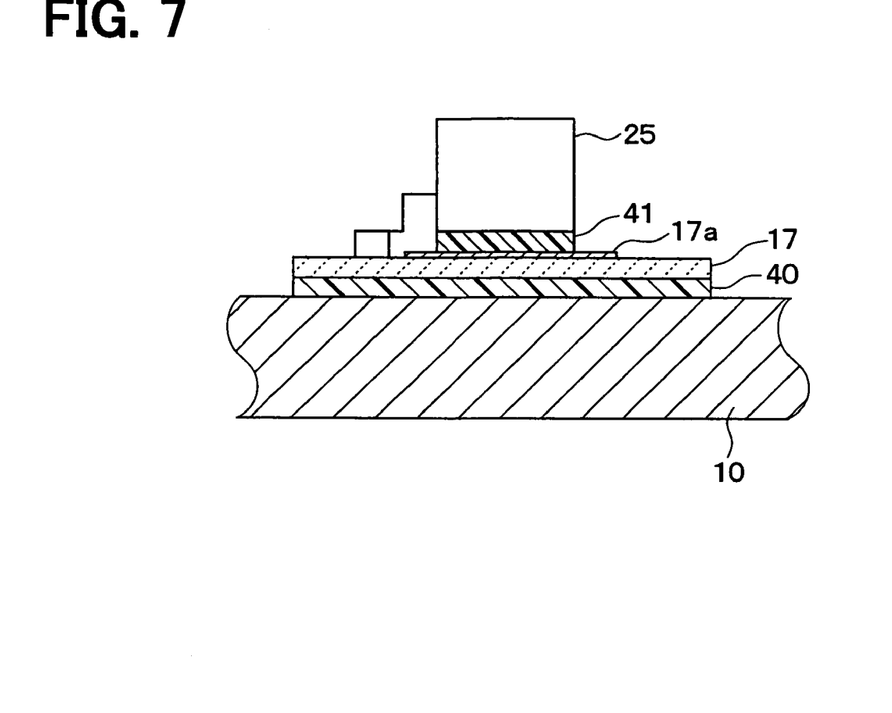
FIG. 7 is a cross-sectional view showing a portion where a transformer unit is fixed to a power circuit board of the lighting apparatus according to the first embodiment.

FIG. 7 is a cross-sectional view showing a portion where the transformer unit 25 is attached to the power circuit board 17. As can be seen from FIG. 7, the transformer unit 25 is fixed to the power circuit board 17 through an adhesive member 41 such that the transformer unit 25 overlaps the conductive pattern 17a. Alternatively, the transformer unit 25 may do not overlap the conductive pattern 17a.

The adhesive member 41 is made of a material that has a viscosity of approximately 10 to 150 pascal-seconds (Pa·s), preferably 30 to 90 Pa·s, a thermal conductivity of approximately more than 0.1 watts per meter kelvin (W/(m·k)), and an electric strength of approximately more than 0.5 kilovolts per millimeter (kV/mm), after being hardened. For example, a CY52-223 or a SE1714, which is a product manufactured by TORAY company in Japan, can be used as the adhesive member 41.

Figure 2:
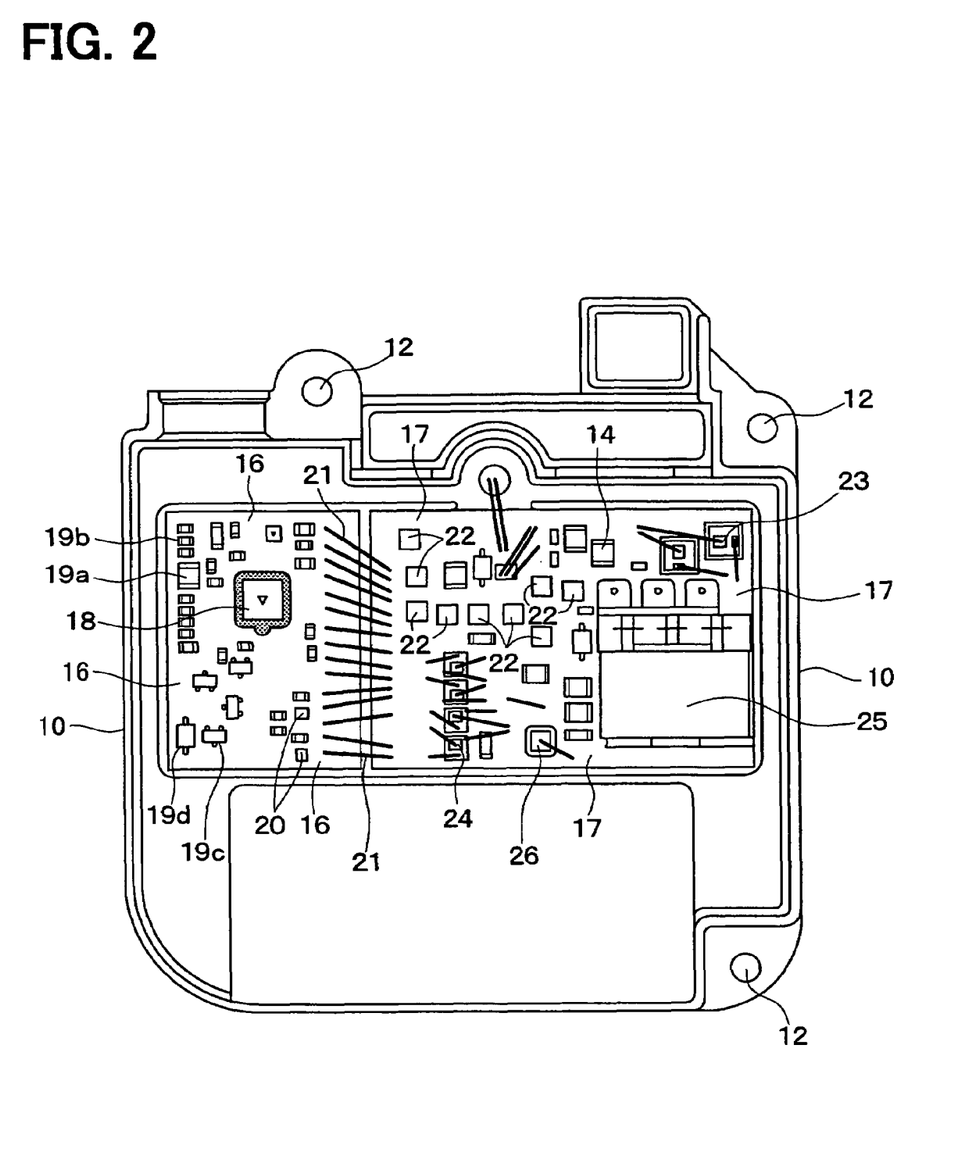
FIG. 2 is a plan view of a casing of the lighting apparatus according to the first embodiment.
Figure 6:
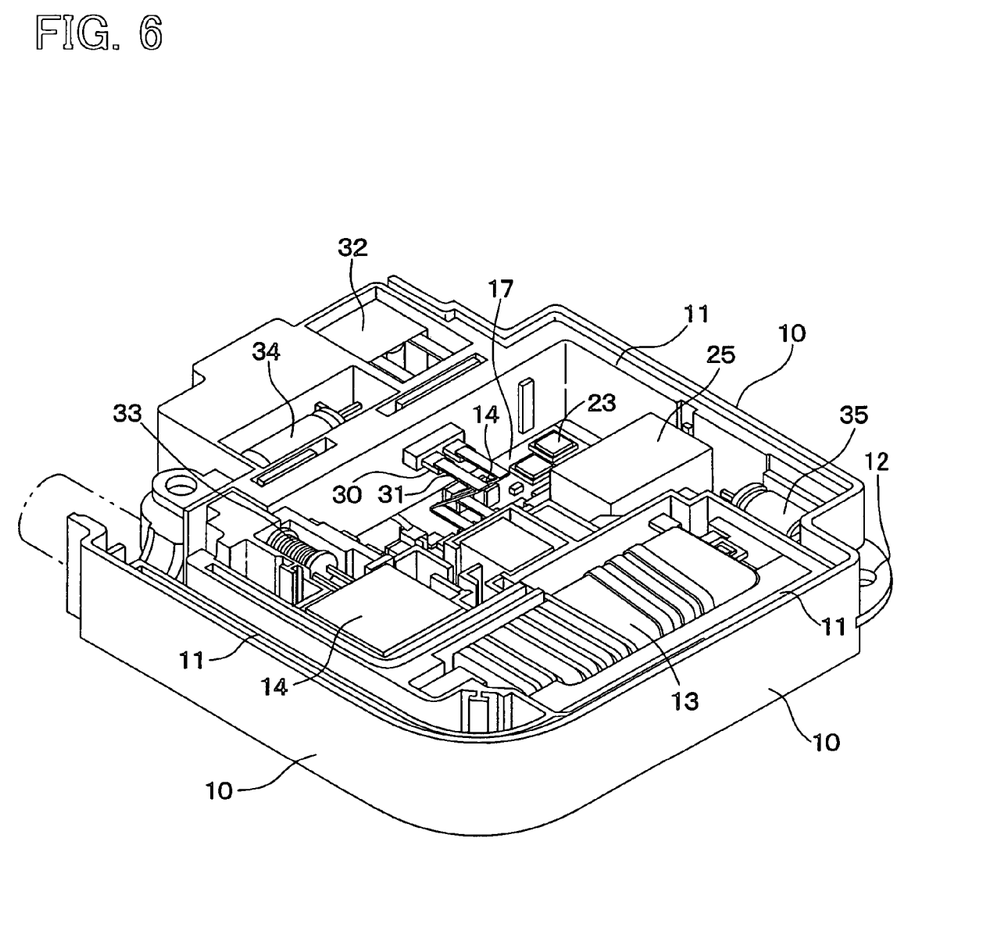
FIG. 6 is a perspective view of FIG. 4.

As shown in FIG. 2, an electrode pad 22 is arranged on a surface of the power circuit board 17. As shown in FIG. 6, when the casing 10 and the busbar casing 11 are assembled into the lighting apparatus, the electrode pad 22 is connected to a case terminal 30 of the busbar casing 11 through a ribbon wire 31. The electrode pad 22 is arranged in a relatively narrow area on the power circuit board 17.

Figure 3:
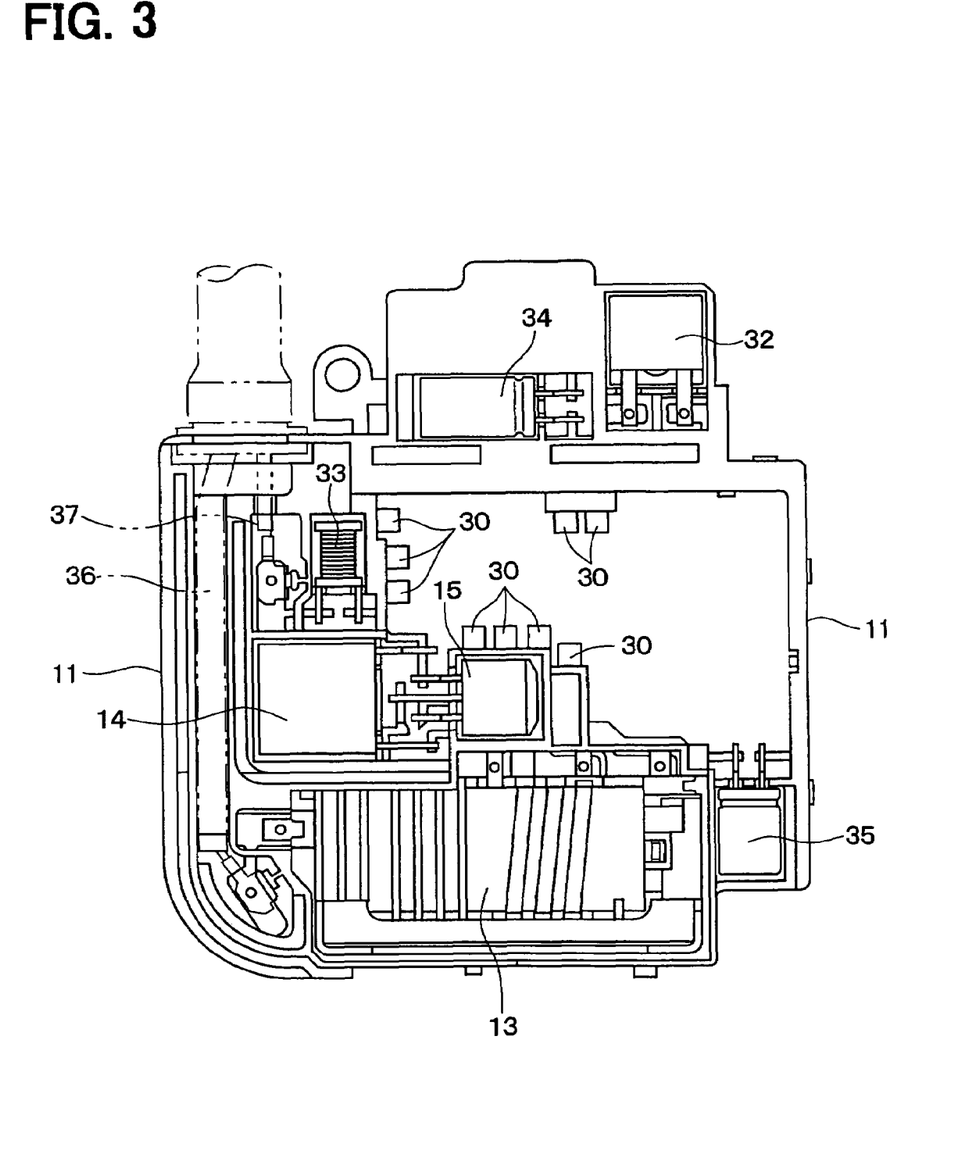
FIG. 3 is a plan view of a busbar casing of the lighting apparatus according to the first embodiment.
Figure 4:
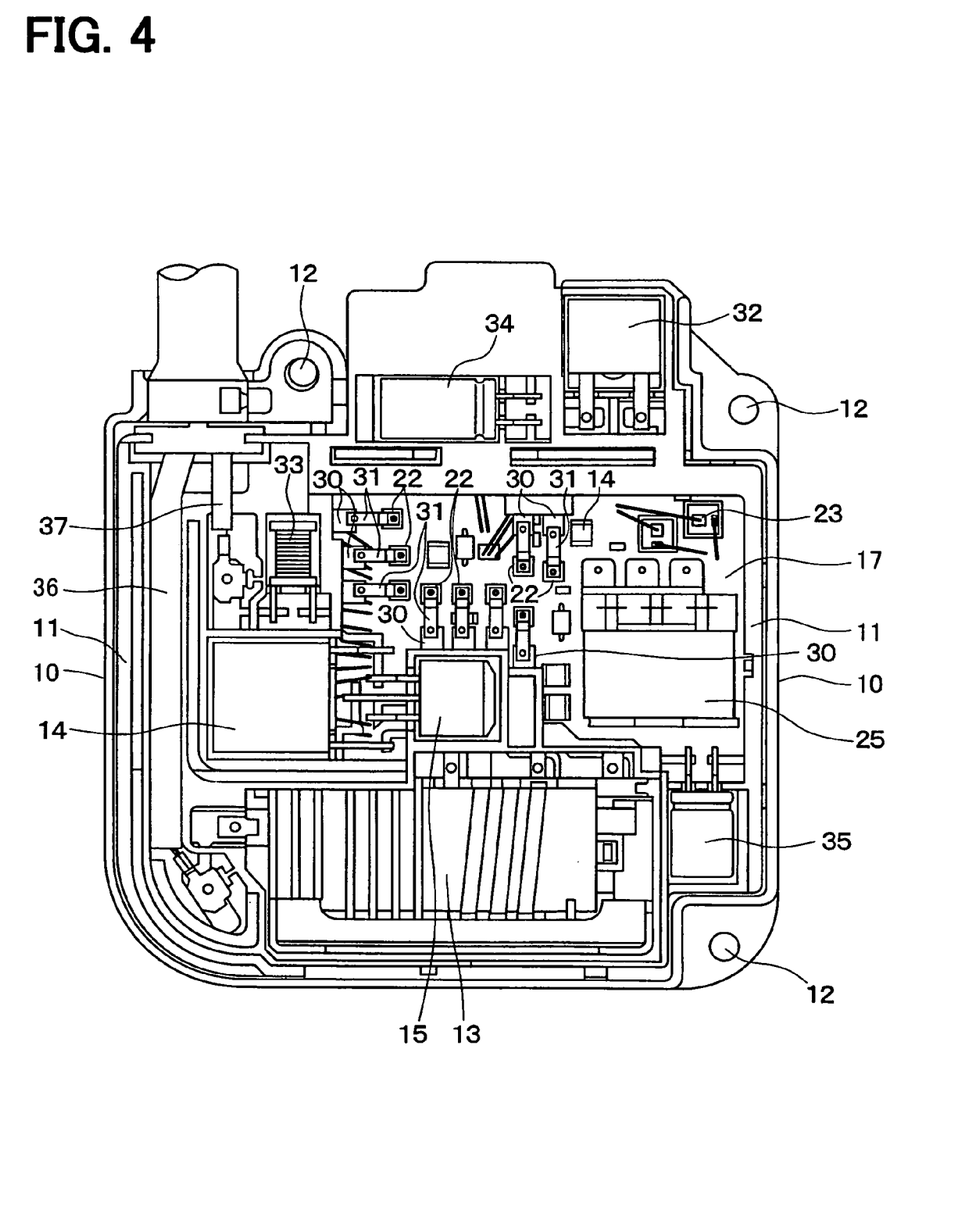
FIG. 4 is a plan view of the lighting apparatus into which the casing of FIG. 2 and the busbar casing of FIG. 3 are assembled.
Figure 5:
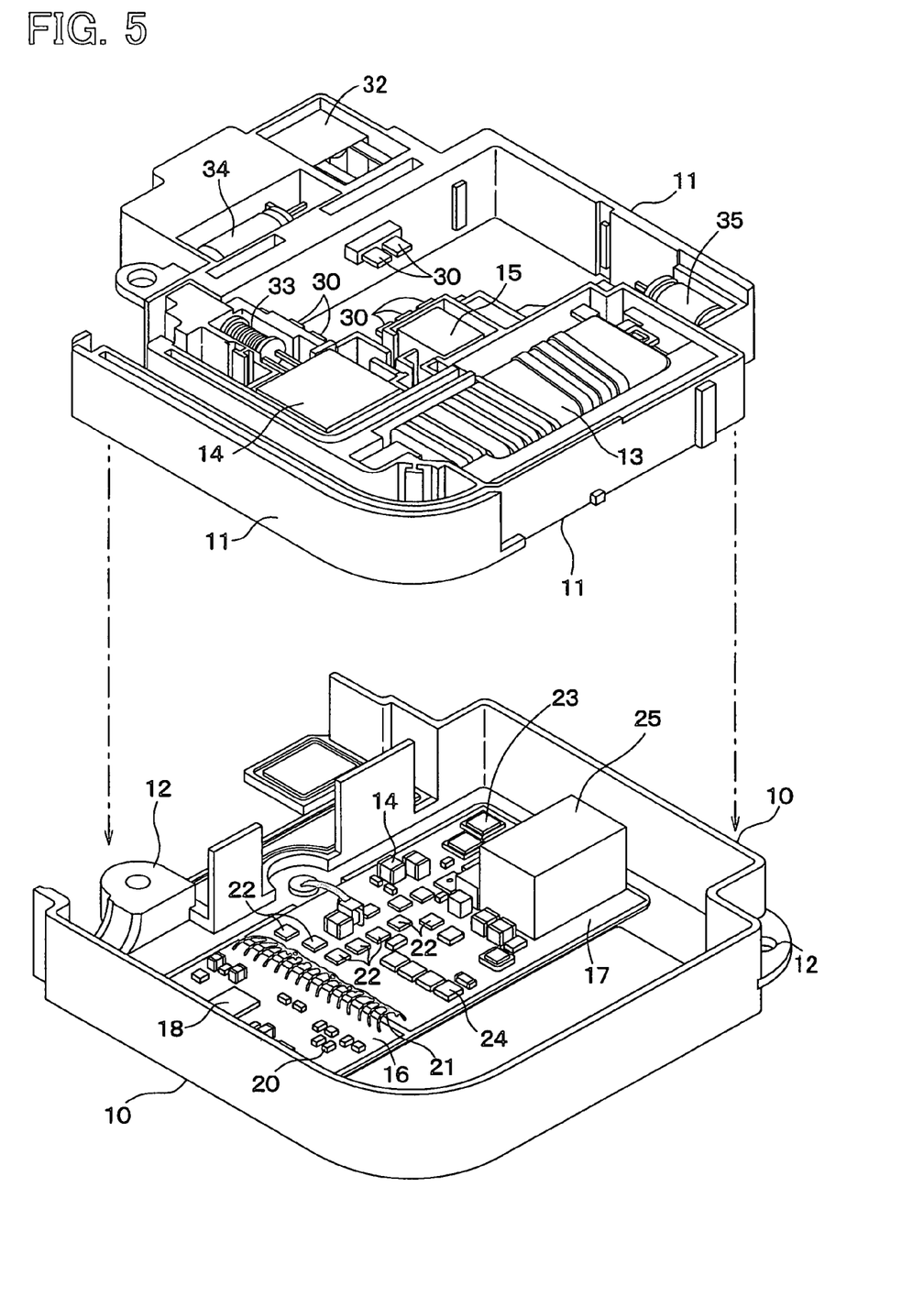
FIG. 5 is a perspective view showing the casing of FIG. 2 and the busbar casing of FIG. 3.

As shown in FIG. 3, the busbar casing 11 has a first space where no component is arranged. As shown in FIG. 5, when the busbar casing 11 is inserted into the casing 10, the electrode pad 22 is positioned in the first space of the busbar casing 11.

As shown in FIG. 2, the casing 10 has a second space adjacent to the control circuit board 16 and the power circuit board 17. As shown in FIG. 5, when the busbar casing 11 is inserted into the casing 10, a starter transformer 13 mounted to the busbar casing 11 is positioned in the second space of the casing 10.

The busbar casing 11 may be, for example, made of synthetic resin and shaped in a rectangular shape that allows the busbar casing 11 to be inserted in the casing 10. When the busbar casing 11 is inserted into the casing 10, the first space of the busbar casing 11 is positioned over the power circuit board 17 mounted to the casing 10 so that the electrode pad 22 can be positioned in the first space of the busbar casing 11.

The case terminal 30 projects from an inner wall of the busbar casing 11 such that the case terminal 30 is positioned in the first space, where the power circuit board 17 is positioned when the busbar casing 11 is inserted into the casing 10. In the first space, the case terminal 30 is connected to the electrode pad 22 through the ribbon wire 31, for example, by laser welding.

As described above, when the busbar casing 11 is inserted into the casing 10, the starter transformer 13 of the busbar casing 11 is positioned in the second space of the casing 10. In the busbar casing 11, a high-tension cable 36 and a low-tension cable 37 are installed. The high-tension cable 36 is installed along an inner perimeter of the busbar casing 11. The high-tension cable 36 has one end connected to the starter transformer 13 and the other end extending to outside of the busbar casing 11. The low-tension cable 37 has one end connected to an output inductor 33 and the other end extending to the outside of the busbar casing 11.

A channel for installing the high-tension cable 36 therein is provided at the inner perimeter of the busbar casing 11. Hollow portions are provided around the inner perimeter of the busbar casing 11. An input inductor 32, the output inductor 33, electrolytic capacitors 14, 34, 35, and a thyristor 15 are arranged in the respective hollow portions of the busbar casing 11. Terminals of the input inductor 32, the output inductor 33, the electrolytic capacitors 14, 34, 35, and the thyristor 15 are connected to the busbar of the busbar casing 11.

Thus, the lighting apparatus of the discharge lamp is provided.

When the lighting apparatus is assembled in a production line, the control circuit board 16 and the power circuit board 17 on which the circuit components such as the transformer unit 25 are premounted are prepared. In the casing 10, the control circuit board 16 and the power circuit board 17 are connected to each other through the bonding wire 21 after being fixed to a predetermined portion of the bottom wall of the casing 10. In the busbar casing 11, the starter transformer 13, the high-tension cable 36, the low-tension cable 37, the input inductor 32, the output conductor 33, the electrolytic capacitors 14, 34, 35, and the thyristor 15 are arranged in the channel and the hollow portions as described above. The high-tension cable 36 and the low-tension cable 37 are connected to the starter transformer 13 and the output inductor 33, respectively. The terminals of the input inductor 32, the output inductor 33, the electrolytic capacitors 14, 34, 35, and the thyristor 15 are connected to the busbar.

Then, the busbar casing 11 is inserted in the casing 10, and the electrode pad 22 of the control circuit board 16 is connected to the case terminal 30 of the busbar casing 11 through the ribbon wire 31, for example, by the laser welding.

Then, the casing 10 is filled with silicone gel (not shown) for protecting the inside of the casing 10 from water damage and enclosed in the case cover (not shown). Therefore, the inside of the casing 10 is sealed.

Thus, the casing 10 and the busbar casing 11 are assembled into the lighting apparatus.

In the lighting apparatus of the first embodiment, the transformer unit 25 is fixed to the power circuit board 17 through the adhesive member 41. Because the adhesive member 41 is made of the material having the thermal conductivity of more than 0.1 W/(m·k), the adhesive member 41 can serve as a heat conductive member.

In the conventional lighting apparatus for the discharge lamp, the DC-DC converter as the transformer is fixed to the busbar in such a manner that the DC-DC converter remains suspended in the air. Therefore, because only air exists between the DC-DC converter and the casing, the heat produced by the DC-DC converter is released into the air. Because air has a very low thermal conductivity of 0.024 W/(m·k), the heat release may be inadequate.

In contrast, in the lighting apparatus of the first embodiment, the heat produced by the transformer core 25 is transferred to the power circuit board 17 through the adhesive member 41 having the thermal conductivity of more than 0.1 W/(m·k), which is much larger than that of air. Then, the transferred heat is transferred to the casing 10 made of metal through the adhesive member 40.

Thus, the lighting apparatus of the first embodiment can release the heat through the casing 10 widely, thereby reducing peak temperature of the transformer unit 25. Therefore, even if the transformer unit 25 is arranged relatively close to other components, the heat produced by the transformer unit 25 can be prevented from affecting the other circuit components.

Further, because the control circuit board 16 is physically separated from the power circuit board 17, heat transfer between the two boards can be reduced. Therefore, by reducing the peak temperature of the transformer unit 25, it is possible to prevent the heat from affecting circuit components mounted to the control circuit board 16.

In the conventional lighting apparatus in which the heat is released into the air, the peak temperature of the DC-DC converter reaches approximately 200° C.

In contrast, in the lighting apparatus of the embodiment, the peak temperature of the transformer unit 25 is reduced to approximately 150° C. so that the heat can be prevented from affecting the other components.

Therefore, in the lighting apparatus of the embodiment, the transformer unit 25 can be arranged relatively close to the other components so that the size of the lighting apparatus can be reduced.

The trans former unit 25 is fixed to the power circuit board 17 through the adhesive member 41 that has the viscosity of 10 to 150 Pa·s, preferably 30 to 90 Pa·s after being hardened. The adhesive member 41 can increase resistance of the transformer unit 25 to vibration of the power circuit board 17.

In the conventional lighting apparatus, because the DC-DC converter remains suspended in the air, only air, or air and a small amount of the silicone gel exist between the DC-DC converter and the casing. Therefore, the DC-DC converter is not securely fixed to the casing and has an insufficient resistance to vibration of the casing.

In this ca se, the silicone gel, which exists between the DC-DC converter and the casing, may increase the resistance of the DC-DC converter to vibration of the casing. However, because the silicone gel has a very low viscosity of 0.9 to 1.5 Pa·s, the resistance to vibration may remain insufficient.

In contrast, in the lighting apparatus of the embodiment, the viscosity of the adhesive member 41 becomes high enough to securely fix the transformer unit 25 to the power circuit board 17 after the adhesive member 41 is hardened. Thus, the adhesive member 41 increases the resistance of the transformer unit 25 to vibration of the power circuit board 17 so that the transformer unit 25 can be securely fixed to the casing 10.

Further, when the transformer unit 25 is fixed to the power circuit board 17 through the adhesive member 41, the conductive pattern 17a of the power circuit board 17 is electrically insulated from the transformer unit 25. Thus, the adhesive member 41 can increase insulation reliability between the transformer unit 25 and the conductive pattern 17a of the power circuit board 17.

As described above, in the embodiment, the transformer unit 25 may be fixed to the power circuit board 17 in such a manner that the transformer unit 25 and the conductive pattern 17a overlap. In this case, when the transformer unit 25 (i.e., DC-DC converter 2) generates the high voltage, a voltage of more than 300 V (e.g., approximately 400 V) may be applied between the transformer unit 25 and the conductive pattern 17a, which is positioned below the transformer unit 25. Therefore, a high reliability of the insulation between the transformer unit 25 and the conductive pattern 17a is required. In the embodiment, the transformer unit 25 is fixed to the power circuit board 17 through the adhesive member 41 so that the high reliability of the insulation can be achieved.

Second Embodiment

Figure 8:
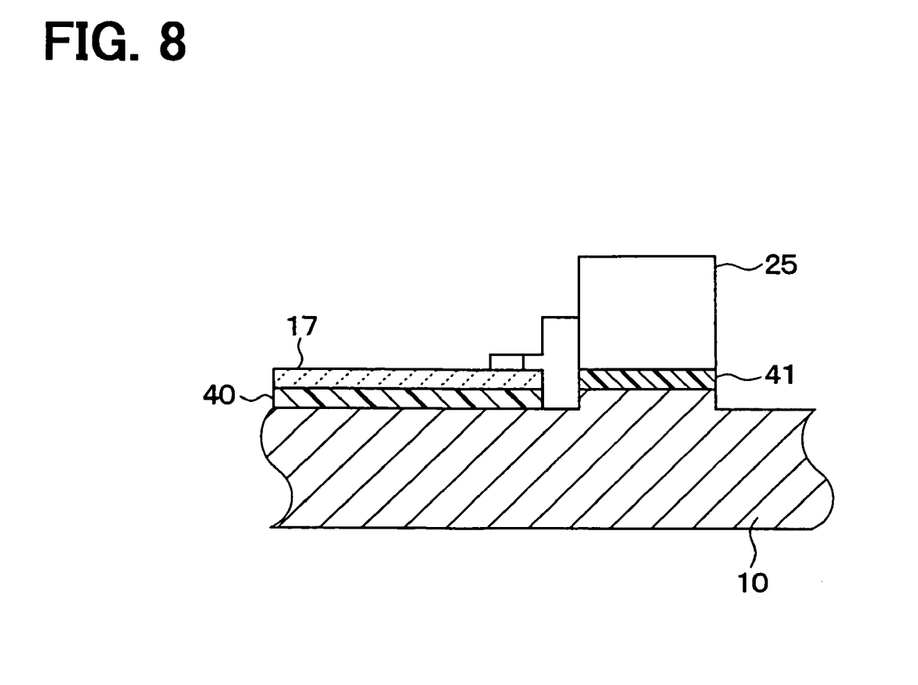
FIG. 8 is a cross-sectional view showing a portion where a transformer unit is fixed to a power circuit board of a discharge lamp lighting apparatus according to a second embodiment of the present invention.

In the second embodiment of the present invention, as shown in FIG. 8, a power circuit board 17 has an opening portion where a casing 10 is exposed. The transformer unit 25 is fixed to the casing 10 through the adhesive member 41 in the opening portion. Thus, the transformer unit 25 is physically separated from the power circuit board 17.

The adhesive member 41 is made of the material that has the viscosity of 10 to 150 Pa·s, preferably 30 to 90 Pa·s, the thermal conductivity of more than 0.1 W/(m·k), and the electric strength of more than 0.5 kV/mm after being hardened.

The heat produced by the transformer unit 25 is transferred to the casing 10 through the adhesive member 41 and then released through the casing 10. Thus, the peak temperature of the transformer unit 25 can be reduced.

The control circuit board 16 and the power circuit board 17 are provided as a different board, i.e. physically separated from each other. Alternatively, the control circuit board 16 and the power circuit board 17 may be provided as a single board.

In the second embodiment, the transformer unit 25 is physically separated from the power circuit board 17. In such an approach, even if the control circuit board 16 and the power circuit board 17 are provided as the single board, the heat produced by the transformer unit 25 can be prevented from being transferred from the power circuit board 17 to the control circuit board 16, where the circuit components having low resistance to heat are mounted.

Third Embodiment

Figure 9A:
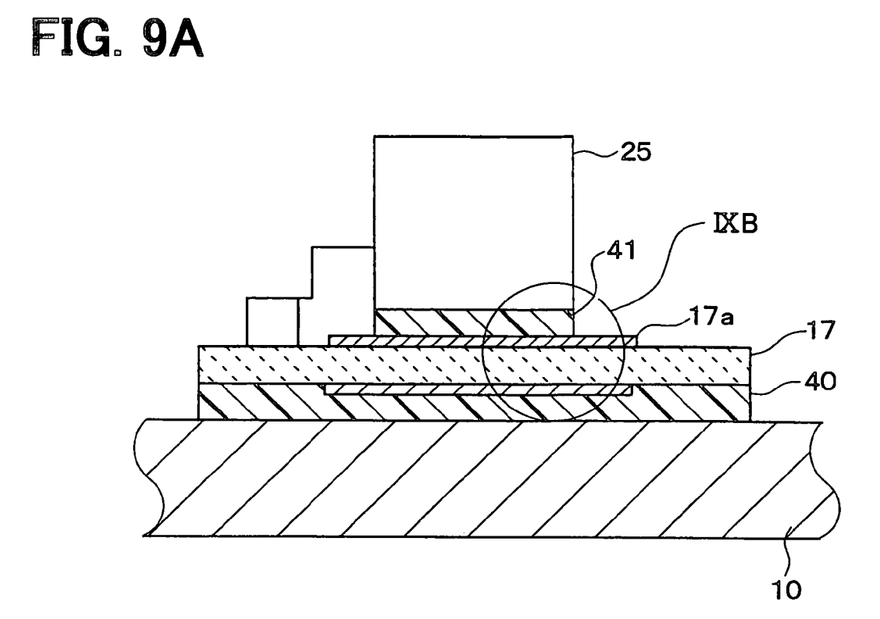
FIG. 9A is a cross-sectional view showing a portion where a transformer unit is fixed to a power circuit board of a discharge lamp lighting apparatus according to a third embodiment of the present invention.
Figure 9B:
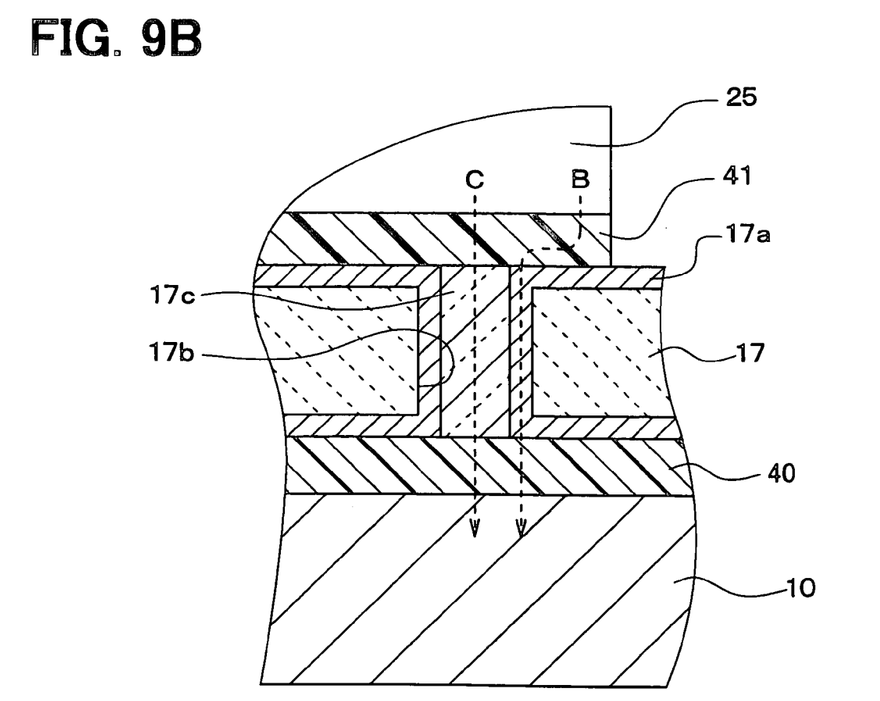
FIG. 9B is a schematic enlarged view showing a region of a circle IXB in FIG. 9A.

In the third embodiment of the present invention, as shown in FIGS. 9A and 9B, a power circuit board 17 has a through-hole 17b.

FIG. 9A is a cross-sectional view showing a portion where the transformer unit 25 is fixed to the power circuit board 17, and FIG. 9B is a schematic enlarged view showing a region of a circle IXB in FIG. 9A. As can be seen from FIG. 9B, the through-hole 17b is positioned where the transformer unit 25 is fixed to the power circuit board 17. A conductive pattern 17a is provided on the power circuit board 17 in such a manner that the conductive pattern 17a passes through the through-hole 17b. The through-hole 17b is filled with a filling member 17c having a higher thermal conductivity than air. The filling member 17c may be, for example, metal powder or an adhesive material. Alternatively, the through-hole 17b may be filled with no filling member 17c.

In this case, the heat produced by the transformer unit 25 is transferred to the casing 10 through both a first heat release path indicated by a dashed line B in FIG. 9B and a second heat release path indicated by a dashed line C in FIG. 9B. In the first heat release path, the heat travels from the transformer unit 25 to the casing 10 through the conductive pattern 17a. In the second heat release path, the heat travels from the transformer unit 25 to the casing 10 through the filling member 17c. Such an approach allows the heat to escape easily so that the lighting apparatus of the fourth embodiment can release the heat more effectively. Thus, the lighting apparatus of the third embodiment can release the heat effectively.

Fourth Embodiment

Figure 10:
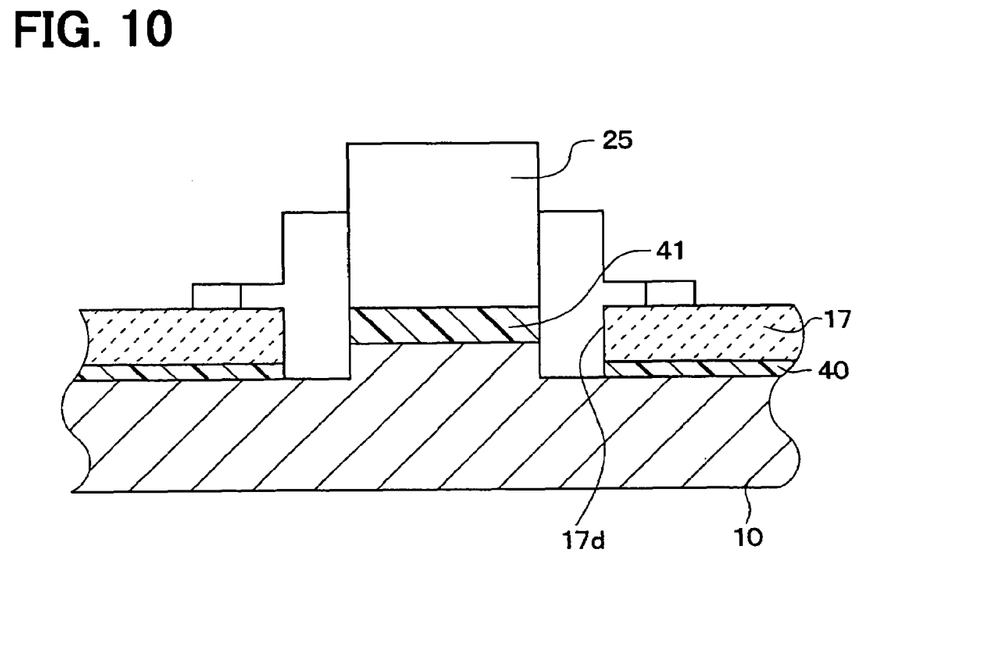
FIG. 10 is a cross-sectional view showing a portion where a transformer unit is fixed to a power circuit board of a discharge lamp lighting apparatus according to a fourth embodiment of the present invention.

In the fourth embodiment of the present invention, as shown in FIG. 10, a power circuit board 17 has a penetrating hole 17d where a casing 10 is exposed. The transformer unit 25 is fixed to the casing 10 through the adhesive member 41 in the penetrating hole 17d.

The adhesive member 41 is made of the material that has the viscosity of 10 to 150 Pa·s, preferably 30 to 90 Pa·s, the thermal conductivity of more than 0.1 W/(m·k), and the electric strength of more than 0.5 kV/mm after being hardened.

The heat produced by the transformer unit 25 is transferred to the casing 10 through the adhesive member 41 and then released through the casing 10. Thus, the peak temperature of the transformer unit 25 can be reduced.

Fifth Embodiment

Figure 11:
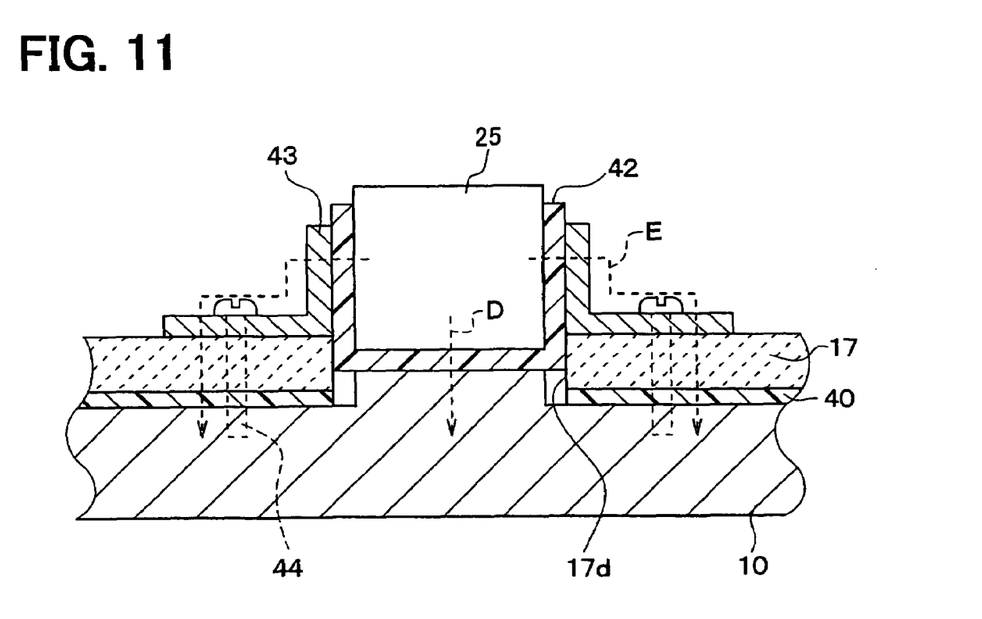
FIG. 11 is a cross-sectional view showing a portion where a transformer unit is fixed to a power circuit board of a discharge lamp lighting apparatus according to a fifth embodiment of the present invention.

In the fifth embodiment of the present invention, as shown in FIG. 11, a power circuit board 17 has an opening portion where a casing 10 is exposed. The transformer unit 25 is fixed to the casing 10 through a heat release sheet 42 in the opening portion. The heat release sheet 42 is arranged not only between the transformer unit 25 and the casing 10, but also on both sides of the transformer unit 25. A metal plate 43 is arranged on both sides of the transformer unit 25 in such a manner that the transformer unit 25 is sandwiched by the metal plate 43 through the heat release sheet 42. The metal plate 43 is fixed to the casing 10 by means of a screw 44.

In this case, the heat produced by the transformer unit 25 is transferred to the casing 10 through both a third heat release path indicated by a dashed line D in FIG. 11 and a fourth heat release path indicated by a dashed line E in FIG. 11. In the third heat release path, the heat travels from the transformer unit 25 to the casing 10 through the heat release sheet 42 in the opening portion. In the fourth heat release path, the heat travels from the transformer unit 25 to the casing 10 through the heat release sheet 42, the metal plate 43, and the screw 44 in that order. Such an approach allows the heat to escape easily so that the lighting apparatus of the fourth embodiment can release the heat more effectively.

Modifications

The embodiments described above may be modified in various ways. For example, in a modification of the second embodiment of FIG. 8, a metal plate 43 and a screw 44 are arranged as shown in FIG. 12.

Figure 12:
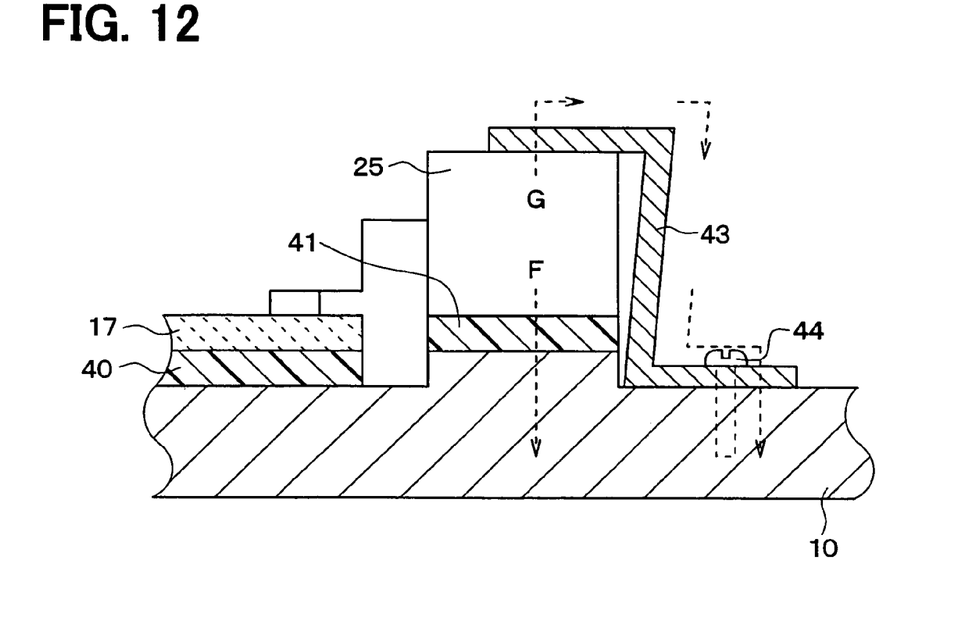
FIG. 12 is a cross-sectional view showing a portion where a transformer unit is fixed to a power circuit board of a discharge lamp lighting apparatus according to a modification of the second embodiment of FIG. 8.

The metal plate 43 is attached to the upper surface of the transformer unit 25, bent downwardly in FIG. 12 (i.e., toward the casing 10), and then bent along the surface of the casing 10. Thus, the metal plate 43 has an approximately Z-shape.

In this case, the heat produced by the transformer unit 25 is transferred to the casing 10 through both a fifth heat release path indicated by a dashed line F in FIG. 12 and a sixth heat release path indicated by a dashed line G in FIG. 12. In the fifth heat release path, the heat travels from the transformer unit 25 to the casing 10 through the adhesive member 41. In the sixth heat release path, the heat travels from the transformer unit 25 to the casing 10 through the metal plate 43 and the screw 44 in that order. Such an approach allows the heat to escape easily so that the lighting apparatus of this modification can release the heat more effectively.

Figure 13:
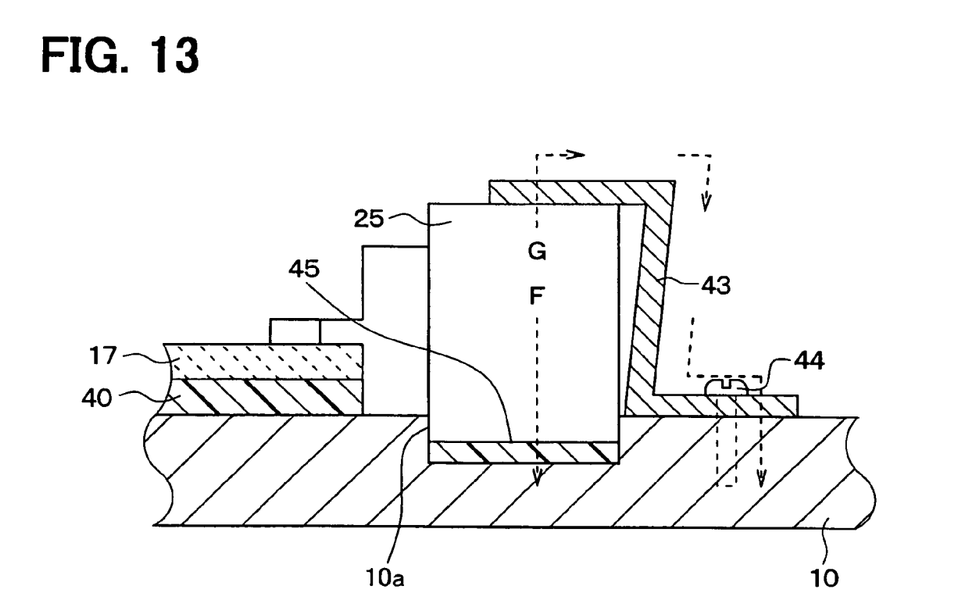
FIG. 13 is a cross-sectional view showing a portion where a transformer unit is fixed to a power circuit board of a discharge lamp lighting apparatus according to another modification of the second embodiment of FIG. 8.

In another modification of the second embodiment of FIG. 8, as shown in FIG. 13a, a casing 10 has a hollow portion 10a. A gel member 45 is disposed in the hollow portion 10a and the transformer unit 25 is arranged in the hollow portion 10a through the gel member 45. Although the gel member 45 may be incapable of providing secure fixation between the transformer unit 25 and the casing 10, the metal plate 23 holds the transformer unit 25 down on the hollow portion 10a of the casing 10. Thus, the transformer unit 25 can be securely fixed to the casing 10.

In this case, the heat produced by the transformer unit 25 is transferred to the casing 10 through both a fifth heat release path indicated by a dashed line F in FIG. 13 and a sixth heat release path indicated by a dashed line G in FIG. 13. In the fifth heat release path, the heat travels from the transformer unit 25 to the casing 10 through the gel member 45. In the sixth heat release path, the heat travels from the transformer unit 25 to the casing 10 through the metal plate 43 and the screw 44 in that order. Such an approach allows the heat to escape easily so that the lighting apparatus of this modification can release the heat more effectively.

Instead of the adhesive member 41, various types of heat conductive members such as the heat release sheet 42 may be used to transfer heat from the transformer unit 25 to the casing 10. Instead of the ceramic-based circuit board, various types of circuit boards such as a printed circuit board made of resin may be used for the control circuit board 16 and the power circuit board 17.

The casing 10 may be made of a material having a thermal conductivity of, for example, more than 5 W/(m·k), preferably more than 20 W/(m·k). For example, the casing 10 may be made of metal, ceramics, resin, carbon fiber, or a composite of at least two of these materials.

Alternatively, the casing 10 may be constructed from a combination of two portions in which the first portion has high thermal conductivity and the second portion has low thermal conductivity. For example, the casing 10 may be constructed such that a metal plate as the first portion is insert-molded into a resin body as the second portion. In this case, the first portion of the casing 10 may be arranged to face a heat-producing component such as the transformer unit 25. The first portion of the casing 10 may have the thermal conductivity of, for example, more than 5/(m·k), preferably more than 20 W/(m·k).

Such changes and modifications are to be understood as being within the scope of the present invention as defined by the appended claims.

What is claimed is:

1. A lighting apparatus for lighting a discharge lamp, comprising:
    a transformer unit including a transformer for generating a high voltage based on an electric power supplied from a power source;
    a casing for housing the transformer unit;
    a circuit board joined to the casing in the casing and including a component for driving the discharge lamp based on the high voltage generated by the transformer; and
    a heat conductive member having a thermal conductivity, wherein
    the transformer unit is fixed to the circuit board through the heat conductive member, and
    the heat conductive member transfers heat produced by the transformer unit to the casing through the circuit board.

2. The lighting apparatus according to claim 1, wherein
    the transformer unit is fixed to a predetermined portion of the circuit board through the heat conductive member,
    the circuit board has a conductive pattern in the predetermined portion,
    the heat conductive member electrically insulates the transformer unit from the conductive pattern of the circuit board, and
    when the transformer included in the transformer unit generates the high voltage, a voltage exceeding approximately 300 volts is applied between the transformer and the conductive pattern of the circuit board.

3. The lighting apparatus according to claim 2, wherein
    the circuit board has a through-hole penetrating through the circuit board in the predetermined portion, and
    the conductive pattern passes through the through-hole.

4. The lighting apparatus according to claim 3, wherein
    the through-hole is filled with a material having a higher thermal conductivity than air.

5. The lighting apparatus according to claim 1, wherein
    the circuit board includes a power circuit board where the transformer unit is fixed, and a control circuit board having a light control circuit for performing a light control of the discharge lamp, and
    the power circuit board is separated from the control circuit board.

6. The lighting apparatus according to claim 1, wherein
    the heat conductive member is an adhesive member for fixing the transformer unit to the circuit board.

7. The lighting apparatus according to claim 6, wherein
    the adhesive member has the thermal conductivity of more than approximately 0.1 W/(m·k).

8. The lighting apparatus according to claim 7, wherein
    the adhesive member has an electric strength of more than approximately 0.5 kV/mm.

9. The lighting apparatus according to claim 1, wherein
    the heat conductive member is a heat release sheet for releasing the heat.

10. The lighting apparatus according to claim 1, wherein
    the transformer unit is arranged close to a portion of the casing, and
    the portion has a thermal conductivity of more than approximately 5 W/(m·k).

11. The lighting apparatus according to claim 1, wherein
    the casing is made of metal, ceramics, resin, carbon fiber, or a composite of at least two of these materials.

12. A lighting apparatus for lighting a discharge lamp, comprising:
    a transformer unit including a transformer for generating a high voltage based on an electric power supplied from a power source;
    a casing for housing the transformer unit;
    a circuit board joined to the casing in the casing and including a component for driving the discharge lamp based on the high voltage generated by the transformer; and
    a heat conductive member having a thermal conductivity, wherein
    the transformer unit is fixed to the casing through the heat conductive member in such a manner that the transformer unit is separated from the circuit board, and
    the heat conductive member transfers heat produced by the transformer unit to the casing.

13. The lighting apparatus according to claim 12, wherein
    the circuit board is constructed as a single board.

14. The lighting apparatus according to claim 12, further comprising:
    a metal plate connected to the transformer unit and the casing, wherein
    both of the heat conductive member and the metal plate transfer the heat produced by the transformer unit to the casing.

15. The lighting apparatus according to claim 14, wherein
    the metal plate has a approximately Z-shape such that the metal plate has one end portion connected to the transformer unit, an other end portion connected to the casing, and a middle portion being present between both of the end portions and having no physical contact with the transformer unit.

16. The lighting apparatus according to claim 15, wherein the casing has a hollow portion in which the transformer unit is fixed to the casing through the heat conductive member.

17. The lighting apparatus according to claim 12, wherein the heat conductive member is an adhesive member for fixing the transformer unit to the casing.

18. The lighting apparatus according to claim 17, wherein the adhesive member has the thermal conductivity of more than approximately 0.1 W/(m·k).

19. A lighting apparatus for lighting a discharge lamp, comprising:
   a transformer unit including a transformer for generating a high voltage based on an electric power supplied from a power source;
   a casing for housing the transformer unit;
   a circuit board joined to the casing in the casing and including a component for driving the discharge lamp based on the high voltage generated by the transformer; and
   a heat conductive member having a thermal conductivity, wherein
   the circuit board has an penetrating hole where the casing is exposed,
   the transformer unit is fixed to the casing through the heat conductive member in the penetrating hole, and
   the heat conductive member transfers heat produced by the transformer unit to the casing.

20. The lighting apparatus according to claim 19, further comprising
   a metal plate connected to the casing, wherein
   the heat conductive member extends to both sides of the transformer unit,
   the metal plate sandwiches both sides of the transformer unit through the heat conductive member, and
   the heat conductive member transfers the heat to the casing both inside the penetrating hole and outside the penetrating hole through the metal plate.

21. The lighting apparatus according to claim 19, wherein the heat conductive member is an adhesive member for fixing the transformer unit to the casing.

22. The lighting apparatus according to claim 21, wherein the adhesive member has the thermal conductivity of more than approximately 0.1 W/(m·k).

* * * * *